US012749728B2

(12) United States Patent
Hu et al.

(10) Patent No.: US 12,749,728 B2
(45) Date of Patent: Sep. 29, 2026

(54) CONFIGURING BATTERY PACKS FOR COMPUTER SYSTEMS

(71) Applicant: International Business Machines Corporation, Armonk, NY (US)

(72) Inventors: Yuanchen Hu, Peekskill, NY (US); Jayapreetha Natesan, Hopewell Junction, NY (US); Milnes P. David, New Paltz, NY (US); Noah Singer, White Plains, NY (US); Natesan Venkateswaran, Hopewell Junction, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 436 days.

(21) Appl. No.: 18/190,771

(22) Filed: Mar. 27, 2023

(65) Prior Publication Data

US 2024/0332655 A1 Oct. 3, 2024

(51) Int. Cl.

| | |
|---|---|
| ***H01M 10/48*** | (2006.01) |
| ***G01R 31/367*** | (2019.01) |
| ***G01R 31/396*** | (2019.01) |
| ***H01M 10/0525*** | (2010.01) |
| ***H01M 50/204*** | (2021.01) |

(52) U.S. Cl.

CPC ........ *H01M 10/486* (2013.01); *G01R 31/367* (2019.01); *G01R 31/396* (2019.01); *H01M 10/0525* (2013.01); *H01M 10/482* (2013.01); *H01M 50/204* (2021.01); *H01M 2220/30* (2013.01)

(58) Field of Classification Search

CPC ............ H01M 10/486; H01M 50/204; H01M 10/0525; H01M 10/482; H01M 2220/30; G01R 31/396; G01R 31/367

See application file for complete search history.

(56) References Cited

U.S. PATENT DOCUMENTS

| | | | |
|---|---|---|---|
| 7,573,236 | B2 | 8/2009 | Sugimoto |
| 9,231,434 | B2 | 1/2016 | Das et al. |
| 10,103,411 | B2 | 10/2018 | Giordano et al. |
| 10,230,137 | B2 | 3/2019 | Lin et al. |
| 10,879,715 | B2 | 12/2020 | Hsu et al. |

(Continued)

FOREIGN PATENT DOCUMENTS

WO WO-2019022065 A1 * 1/2019 ............ H01M 10/44

OTHER PUBLICATIONS

"List of IBM Patents or Patent Applications Treated As Related," for U.S. Appl. No. 18/190,771, filed Mar. 27, 2023.

(Continued)

*Primary Examiner* — Alexander Usyatinsky

(74) *Attorney, Agent, or Firm* — Stosch Sabo, Esq.; Kevin P. Radigan, Esq.; Heslin Rothenberg Farley & Mesiti P.C.

(57) ABSTRACT

Embodiments of the present disclosure provide systems and methods for configuring battery packs, such as used in computer systems. The disclosed systems and methods provide an optimal battery configuration of battery cell types in the battery pack, improving battery performance and a functional operational period for the battery pack. The disclosed systems and methods select an optimal battery type for each position of the battery cells in a linear battery cell string of the battery pack.

20 Claims, 11 Drawing Sheets

(56) References Cited

U.S. PATENT DOCUMENTS

| | | | | |
|---|---|---|---|---|
| 10,996,280 | B2 | 5/2021 | Tachibana et al. | |
| 11,108,094 | B2 * | 8/2021 | Fink | G01R 31/367 |
| 11,114,708 | B2 | 9/2021 | Kim et al. | |
| 11,152,656 | B1 | 10/2021 | Huang et al. | |
| 11,215,667 | B1 | 1/2022 | Zhang et al. | |
| 2015/0069975 | A1 | 3/2015 | Farah et al. | |
| 2015/0132615 | A1 * | 5/2015 | Yun | H01M 10/488 429/61 |
| 2017/0117725 | A1 * | 4/2017 | Hendricks | G01K 3/14 |
| 2018/0183245 | A1 * | 6/2018 | Wang | G01R 31/392 |
| 2021/0184282 | A1 | 6/2021 | Sarfert et al. | |
| 2021/0218076 | A1 * | 7/2021 | Fink | G01R 31/392 |
| 2021/0288353 | A1 | 9/2021 | Gottapu et al. | |
| 2021/0288356 | A1 | 9/2021 | Tsutsui et al. | |
| 2022/0140635 | A1 | 5/2022 | Hines et al. | |
| 2024/0332665 | A1 | 10/2024 | Hu et al. | |

OTHER PUBLICATIONS

Du, J. et al., (2021), "Thermal Management of Air-Cooling Lithium-Ion Battery Pack," Chinese Physics Letters, 38(11), 18201. doi: 10.1088/0256-307X/38/11/118201.

Shahid et al.; "Analysis of Cooling Effectiveness And Temperature Uniformity In A Battery Pack For Cyclindrical Batteries", Energies, vol. 10, Iss. 8, pp. 1-17,Aug. 7, 2017.

Hu et al., "Air-Cooled Battery-Pack Thermals and Capacities Under Various Operating Temperature and Processes," ResearchGate, Dated: Jul. 2020, pp. 1-6.

Ludwig et al., "Determination of Internal Temperature Differences for Various Cylindrical Lithium-Ion Batteries Using a Pulse Resistance Approach," MDPI: batteries, Dated: Jun. 22, 2022, pp. 1-25.

Ndaomanu et al., "Battery Temperature Rate of Change Estimation by Using Machine Learning," ResearchGate, Date: Nov. 2019, pp. 1-8.

Sayfutdinov et al., "Optimal utilization strategy of the LiFePO4 battery storage," Applied Energy 316, Year: 2022, pp. 1-11.

Cao, J., Ling, Z., Fang, X., & Zhang, Z. (2020). Delayed liquid cooling strategy with phase change material to achieve high temperature uniformity of Li-ion battery under high-rate discharge. Journal of Power Sources, 450, 227673. doi:10.1016/j.jpowsour.2019.227673 [Abstract Only].

Chiu, K.-C., Lin, C.-H., Yeh, S.-F., Lin, Y.-H., Huang, C.-S., & Chen, K.-C. (2014). Cycle life analysis of series connected lithium-ion batteries with temperature difference. Journal of Power Sources, 263, 75-84. doi:10.1016/j.jpowsour.2014.04.034 [Abstract Only].

Yang, N., Zhang, X., Shang, B., & Li, G. (2016). Unbalanced discharging and aging due to temperature differences among the cells in a lithium-ion battery pack with parallel combination. Journal of Power Sources, 306, 733-741. doi:10.1016/j.jpowsour.2015.12.079 [Abstract Only].

Park et al., "Battery cell arrangement and heat transfer fluid effects on the parasitic power consumption and the cell temperature distribution in a hybrid electric vehicle," Journal of Power Sources, vol. 227, Year: 2013, pp. 191-198 [Abstract Only].

* cited by examiner

CONFIGURING BATTERY PACKS FOR COMPUTER SYSTEMS

BACKGROUND

The present invention relates to battery systems and configurations, and more specifically, to systems and methods for configuring battery packs used in computer systems to obtain optimal battery performance and functional operational period for the battery packs.

Reliability of battery packs can significantly influence uninterrupted operation of computer systems. For example, an internal battery feature (IBF) with battery packs as a local uninterrupted power source can enhance the robustness of the power design of a mainframe system and decrease power line disturbance to the mainframe. Higher performing battery packs are needed for computer systems.

SUMMARY

Embodiments of the present disclosure provide systems and methods for configuring battery packs, such as used in computer systems. The disclosed systems and methods provide an optimal battery configuration of battery cell types in the battery pack, improving battery performance and a functional operational period for the battery pack, assigning an optimal battery type to each battery cell in a linear battery cell string of the battery pack.

A disclosed non-limiting computer-implemented method comprises receiving predefined characteristics of multiple different candidate battery cell types and a desired number and voltage of a plurality of battery cells to be used to form a linear battery cell string for a battery pack. The system determines, for each position of the battery cells in the linear cell string, battery parameters for each of the different candidate cell types. The parameters comprise at least one of computed battery temperature, computed battery usable capacity, or computed battery efficiency. The system formulates an integer linear problem to optimize a battery configuration for the battery pack based on the battery parameters. The system solves the integer linear problem to select, one of the different candidate battery types to place at each of the positions of the battery cells in the linear cell string.

Other disclosed embodiments include a computer system and computer program product for configuring battery packs, implementing features of the above-disclosed method.

DETAILED DESCRIPTION

Figure 1:
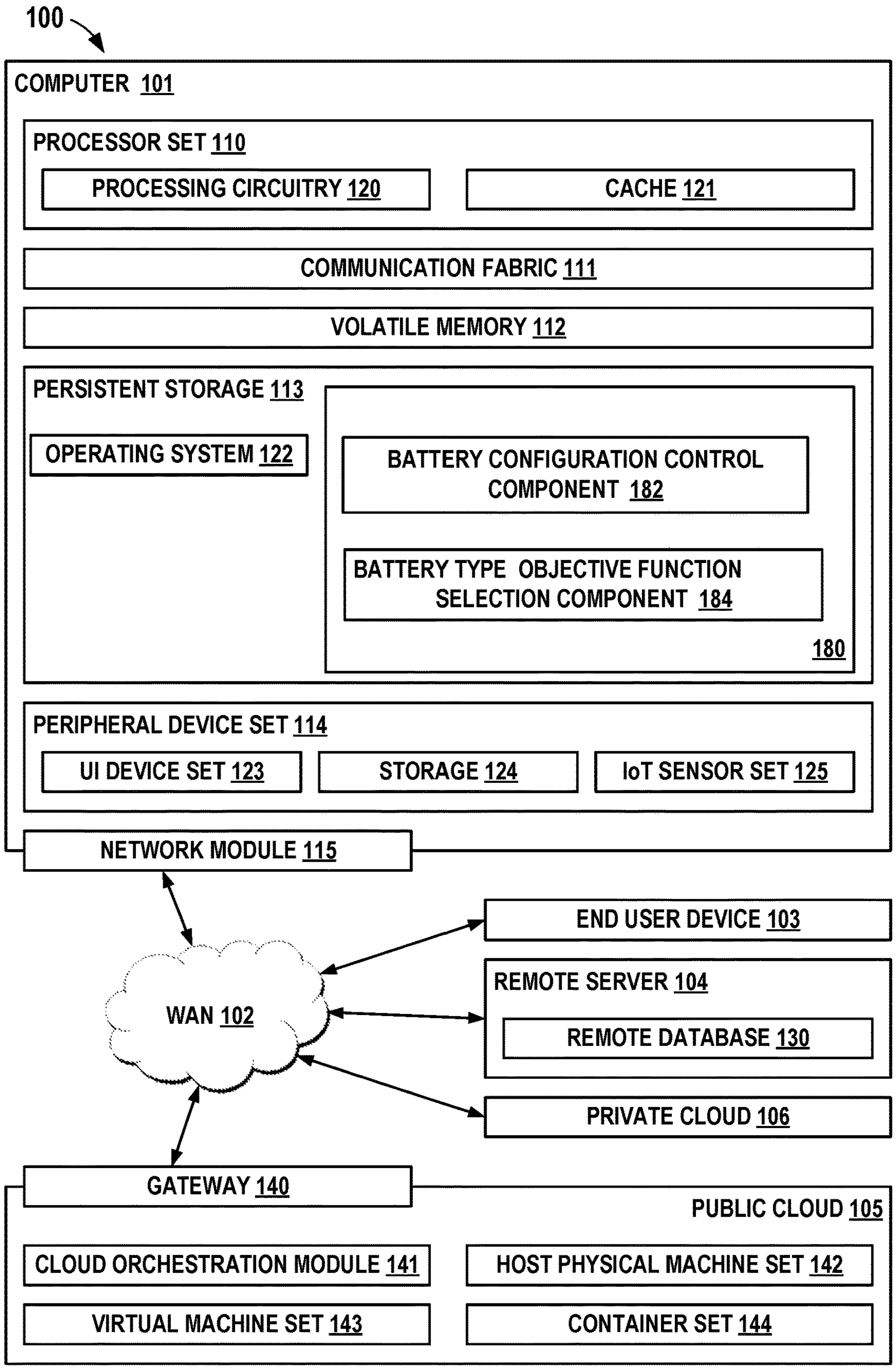
FIG. 1 is a block diagram of an example computer environment for use in conjunction with one or more disclosed embodiments for configuring battery packs in computer systems.

Embodiments of the disclosure provide systems and methods for configuring battery packs, for example used in computer systems. In one embodiment, the battery pack comprises a number (N) of cells connected together in a linear cell string, and a number (M) of battery cell types. A goal for implementing enhanced battery pack performance comprises identifying an optimized battery configuration, assigning a battery cell type for each position of battery cells in the linear battery cell string in the battery pack. A plurality of inputs are accessed, such as array of M different types of battery cells and an array of N batteries. Additional inputs accessed include, for example, a graph of temperature versus usable battery capacity, a graph of discharge current versus thermal dissipation, a cost of the battery (B_cost), other factors affecting battery performance efficiency, a temperature gradient versus location in a given battery pack and a position of a given battery in the battery pack. For each battery cell, selected parameters such as related to battery pack efficiency are determined, such as computed battery temperature, computed battery usable capacity, and computed battery efficiency. In one example, the system formulates and solves an integer linear problem and assigns a battery type to each position of the battery cells in the linear battery cell string of the battery pack.

In disclosed embodiments, a metal structure having high thermal conductivity, such as a metal mesh structure is positioned in contact engagement with battery cells at identified positions. The metal mesh structures can provide cooling to compensate for a difference in surface temperature of battery cells at different positions of a battery cell string of the battery pack, to provide optimal battery cell capacity with a more uniform surface temperature of all the battery cells. The surface temperature of battery cells can vary by position of battery cells of the battery pack, with battery cells at some positions having a lower surface temperature than other battery cells. In disclosed embodiments, the metal mesh structure is positioned with selected pairs of battery cells (e.g., to maintain in the desired surface temperature range of the selected battery cells), to achieve optimal battery capacity. The cooling metal mesh structures are configured to reduce flow impedance to a cooling flow path of the battery pack, while reducing battery cell surface temperature gradients by position of battery cells of the linear battery cell string of the battery pack. However, the metal mesh structures can be used independently of the battery positioning techniques discussed herein. For example, the metal mesh structure can be used to cool a single battery (e.g., battery cell), or to cool batteries arranged in a 2D or 3D array.

In one embodiment, the cooling porous metal mesh structure is formed of an Aluminum or Copper cylindrical mesh structure. For example, the cylindrical metal mesh structure is readily deformable, enabling battery pack installation and removal for example for battery cell servicing.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In the following, reference is made to embodiments presented in this disclosure. However, the scope of the present disclosure is not limited to specific described embodiments. Instead, any combination of the following features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

Various aspects of the present disclosure are described by narrative text, flowcharts, block diagrams of computer systems and/or block diagrams of the machine logic included in computer program product (CPP) embodiments. With respect to any flowcharts, depending upon the technology involved, the operations can be performed in a different order than what is shown in a given flowchart. For example, again depending upon the technology involved, two operations shown in successive flowchart blocks may be performed in reverse order, as a single integrated step, concurrently, or in a manner at least partially overlapping in time.

A computer program product embodiment ("CPP embodiment" or "CPP") is a term used in the present disclosure to describe any set of one, or more, storage media (also called "mediums") collectively included in a set of one, or more, storage devices that collectively include machine readable code corresponding to instructions and/or data for performing computer operations specified in a given CPP claim. A "storage device" is any tangible device that can retain and store instructions for use by a computer processor. Without limitation, the computer readable storage medium may be an electronic storage medium, a magnetic storage medium, an optical storage medium, an electromagnetic storage medium, a semiconductor storage medium, a mechanical storage medium, or any suitable combination of the foregoing. Some known types of storage devices that include these mediums include: diskette, hard disk, random access memory (RAM), read-only memory (ROM), erasable programmable read-only memory (EPROM or Flash memory), static random access memory (SRAM), compact disc read-only memory (CD-ROM), digital versatile disk (DVD), memory stick, floppy disk, mechanically encoded device (such as punch cards or pits/lands formed in a major surface of a disc) or any suitable combination of the foregoing. A computer readable storage medium, as that term is used in the present disclosure, is not to be construed as storage in the form of transitory signals per se, such as radio waves or other freely propagating electromagnetic waves, electromagnetic waves propagating through a waveguide, light pulses passing through a fiber optic cable, electrical signals communicated through a wire, and/or other transmission media. As will be understood by those of skill in the art, data is typically moved at some occasional points in time during normal operations of a storage device, such as during access, de-fragmentation or garbage collection, but this does not render the storage device as transitory because the data is not transitory while it is stored.

Computing environment 100 contains an example of an environment for the execution of at least some of the computer code involved in performing the inventive methods, such as a Battery Configuration Control Component 182 and a Battery Type Objective Function Selection Component 184, at block 180. In addition to block 180, computing environment 100 includes, for example, computer 101, wide area network (WAN) 102, end user device (EUD) 103, remote server 104, public cloud 105, and private cloud 106. In this embodiment, computer 101 includes processor set 110 (including processing circuitry 120 and cache 121), communication fabric 111, volatile memory 112, persistent storage 113 (including operating system 122 and block 180, as identified above), peripheral device set 114 (including user interface (UI) device set 123, storage 124, and Internet of Things (IoT) sensor set 125), and network module 115. Remote server 104 includes remote database 130. Public cloud 105 includes gateway 140, cloud orchestration module 141, host physical machine set 142, virtual machine set 143, and container set 144.

COMPUTER 101 may take the form of a desktop computer, laptop computer, tablet computer, smart phone, smart watch or other wearable computer, mainframe computer, quantum computer or any other form of computer or mobile device now known or to be developed in the future that is capable of running a program, accessing a network or querying a database, such as remote database 130. As is well understood in the art of computer technology, and depending upon the technology, performance of a computer-implemented method may be distributed among multiple computers and/or between multiple locations. On the other hand, in this presentation of computing environment 100, detailed discussion is focused on a single computer, specifically computer 101, to keep the presentation as simple as possible. Computer 101 may be located in a cloud, even though it is not shown in a cloud in FIG. 1. On the other hand, computer 101 is not required to be in a cloud except to any extent as may be affirmatively indicated.

PROCESSOR SET 110 includes one, or more, computer processors of any type now known or to be developed in the future. Processing circuitry 120 may be distributed over multiple packages, for example, multiple, coordinated integrated circuit chips. Processing circuitry 120 may implement multiple processor threads and/or multiple processor cores. Cache 121 is memory that is located in the processor chip package(s) and is typically used for data or code that should be available for rapid access by the threads or cores running on processor set 110. Cache memories are typically organized into multiple levels depending upon relative proximity to the processing circuitry. Alternatively, some, or all, of the cache for the processor set may be located "off chip." In some computing environments, processor set 110 may be designed for working with qubits and performing quantum computing.

Computer readable program instructions are typically loaded onto computer 101 to cause a series of operational steps to be performed by processor set 110 of computer 101 and thereby effect a computer-implemented method, such that the instructions thus executed will instantiate the methods specified in flowcharts and/or narrative descriptions of computer-implemented methods included in this document (collectively referred to as "the inventive methods"). These computer readable program instructions are stored in various types of computer readable storage media, such as cache 121 and the other storage media discussed below. The program instructions, and associated data, are accessed by processor set 110 to control and direct performance of the inventive methods. In computing environment 100, at least some of the instructions for performing the inventive methods may be stored in block 180 in persistent storage 113.

COMMUNICATION FABRIC 111 is the signal conduction path that allows the various components of computer 101 to communicate with each other. Typically, this fabric is made of switches and electrically conductive paths, such as the switches and electrically conductive paths that make up busses, bridges, physical input/output ports and the like. Other types of signal communication paths may be used, such as fiber optic communication paths and/or wireless communication paths.

VOLATILE MEMORY 112 is any type of volatile memory now known or to be developed in the future. Examples include dynamic type random access memory (RAM) or static type RAM. Typically, volatile memory 112 is characterized by random access, but this is not required unless affirmatively indicated. In computer 101, the volatile memory 112 is located in a single package and is internal to computer 101, but, alternatively or additionally, the volatile memory may be distributed over multiple packages and/or located externally with respect to computer 101.

PERSISTENT STORAGE 113 is any form of non-volatile storage for computers that is now known or to be developed in the future. The non-volatility of this storage means that the stored data is maintained regardless of whether power is being supplied to computer 101 and/or directly to persistent storage 113. Persistent storage 113 may be a read only memory (ROM), but typically at least a portion of the persistent storage allows writing of data, deletion of data and re-writing of data. Some familiar forms of persistent storage include magnetic disks and solid state storage devices. Operating system 122 may take several forms, such as various known proprietary operating systems or open source Portable Operating System Interface-type operating systems that employ a kernel. The code included in block 180 typically includes at least some of the computer code involved in performing the inventive methods.

PERIPHERAL DEVICE SET 114 includes the set of peripheral devices of computer 101. Data communication connections between the peripheral devices and the other components of computer 101 may be implemented in various ways, such as Bluetooth connections, Near-Field Communication (NFC) connections, connections made by cables (such as universal serial bus (USB) type cables), insertion-type connections (for example, secure digital (SD) card), connections made through local area communication networks and even connections made through wide area networks such as the internet. In various embodiments, UI device set 123 may include components such as a display screen, speaker, microphone, wearable devices (such as goggles and smart watches), keyboard, mouse, printer, touchpad, game controllers, and haptic devices. Storage 124 is external storage, such as an external hard drive, or insertable storage, such as an SD card. Storage 124 may be persistent and/or volatile. In some embodiments, storage 124 may take the form of a quantum computing storage device for storing data in the form of qubits. In embodiments where computer 101 is required to have a large amount of storage (for example, where computer 101 locally stores and manages a large database) then this storage may be provided by peripheral storage devices designed for storing very large amounts of data, such as a storage area network (SAN) that is shared by multiple, geographically distributed computers. IoT sensor set 125 is made up of sensors that can be used in Internet of Things applications. For example, one sensor may be a thermometer and another sensor may be a motion detector.

NETWORK MODULE 115 is the collection of computer software, hardware, and firmware that allows computer 101 to communicate with other computers through WAN 102. Network module 115 may include hardware, such as modems or Wi-Fi signal transceivers, software for packetizing and/or de-packetizing data for communication network transmission, and/or web browser software for communicating data over the internet. In some embodiments, network control functions and network forwarding functions of network module 115 are performed on the same physical hardware device. In other embodiments (for example, embodiments that utilize software-defined networking (SDN)), the control functions and the forwarding functions of network module 115 are performed on physically separate devices, such that the control functions manage several different network hardware devices. Computer readable program instructions for performing the inventive methods can typically be downloaded to computer 101 from an external computer or external storage device through a network adapter card or network interface included in network module 115.

WAN 102 is any wide area network (for example, the internet) capable of communicating computer data over non-local distances by any technology for communicating computer data, now known or to be developed in the future. In some embodiments, the WAN 102 may be replaced and/or supplemented by local area networks (LANs) designed to communicate data between devices located in a local area, such as a Wi-Fi network. The WAN and/or LANs typically include computer hardware such as copper transmission cables, optical transmission fibers, wireless transmission, routers, firewalls, switches, gateway computers and edge servers.

END USER DEVICE (EUD) 103 is any computer system that is used and controlled by an end user (for example, a customer of an enterprise that operates computer 101), and may take any of the forms discussed above in connection with computer 101. EUD 103 typically receives helpful and useful data from the operations of computer 101. For example, in a hypothetical case where computer 101 is designed to provide a recommendation to an end user, this recommendation would typically be communicated from network module 115 of computer 101 through WAN 102 to EUD 103. In this way, EUD 103 can display, or otherwise present, the recommendation to an end user. In some embodiments, EUD 103 may be a client device, such as thin client, heavy client, mainframe computer, desktop computer and so on.

REMOTE SERVER 104 is any computer system that serves at least some data and/or functionality to computer 101. Remote server 104 may be controlled and used by the same entity that operates computer 101. Remote server 104 represents the machine(s) that collect and store helpful and useful data for use by other computers, such as computer 101. For example, in a hypothetical case where computer 101 is designed and programmed to provide a recommendation based on historical data, then this historical data may be provided to computer 101 from remote database 130 of remote server 104.

PUBLIC CLOUD 105 is any computer system available for use by multiple entities that provides on-demand availability of computer system resources and/or other computer capabilities, especially data storage (cloud storage) and computing power, without direct active management by the user. Cloud computing typically leverages sharing of resources to achieve coherence and economics of scale. The direct and active management of the computing resources of public cloud 105 is performed by the computer hardware and/or software of cloud orchestration module 141. The computing resources provided by public cloud 105 are typically implemented by virtual computing environments that run on various computers making up the computers of host physical machine set 142, which is the universe of physical computers in and/or available to public cloud 105. The virtual computing environments (VCEs) typically take the form of virtual machines from virtual machine set 143 and/or containers from container set 144. It is understood that these VCEs may be stored as images and may be transferred among and between the various physical machine hosts, either as images or after instantiation of the VCE. Cloud orchestration module 141 manages the transfer and storage of images, deploys new instantiations of VCEs and manages active instantiations of VCE deployments. Gateway 140 is the collection of computer software, hardware, and firmware that allows public cloud 105 to communicate through WAN 102.

Some further explanation of virtualized computing environments (VCEs) will now be provided. VCEs can be stored as "images." A new active instance of the VCE can be instantiated from the image. Two familiar types of VCEs are virtual machines and containers. A container is a VCE that uses operating-system-level virtualization. This refers to an operating system feature in which the kernel allows the existence of multiple isolated user-space instances, called containers. These isolated user-space instances typically behave as real computers from the point of view of programs running in them. A computer program running on an ordinary operating system can utilize all resources of that computer, such as connected devices, files and folders, network shares, CPU power, and quantifiable hardware capabilities. However, programs running inside a container can only use the contents of the container and devices assigned to the container, a feature which is known as containerization.

PRIVATE CLOUD 106 is similar to public cloud 105, except that the computing resources are only available for use by a single enterprise. While private cloud 106 is depicted as being in communication with WAN 102, in other embodiments a private cloud may be disconnected from the internet entirely and only accessible through a local/private network. A hybrid cloud is a composition of multiple clouds of different types (for example, private, community or public cloud types), often respectively implemented by different vendors. Each of the multiple clouds remains a separate and discrete entity, but the larger hybrid cloud architecture is bound together by standardized or proprietary technology that enables orchestration, management, and/or data/application portability between the multiple constituent clouds. In this embodiment, public cloud 105 and private cloud 106 are both part of a larger hybrid cloud.

Embodiments of the present disclosure provide systems and methods for implementing enhanced operational reliability of battery packs, such as used in computer systems. The disclosed systems and methods optimize battery capacity and extend a functional period for the battery pack, assigning an optimized battery type to each battery cell in the battery pack.

Figure 2:
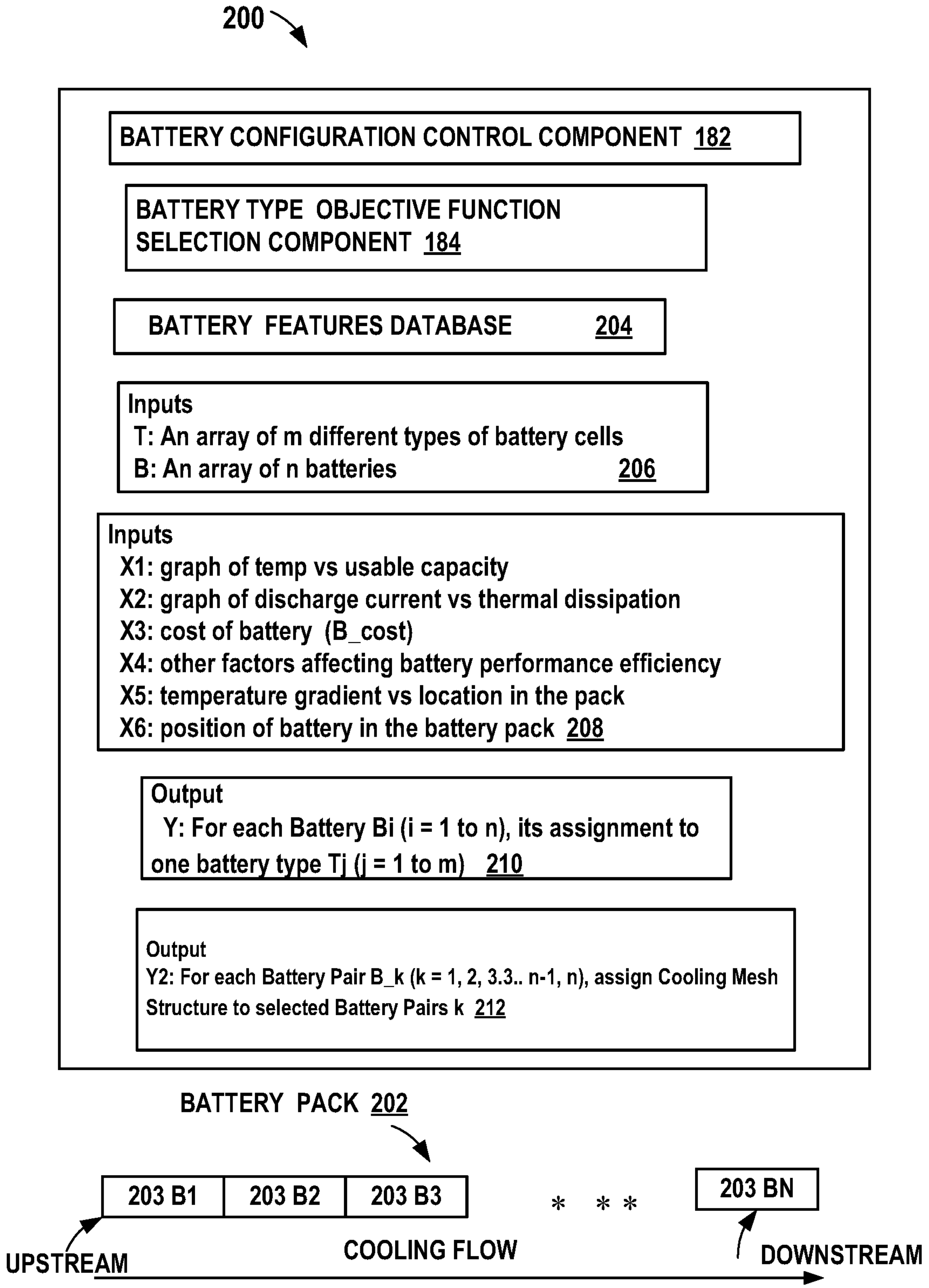
FIG. 2 is a block diagram of an example system for configuring battery packs in computer systems of one or more disclosed embodiments; of one or more disclosed embodiments.

FIG. 2 illustrates an example system 200 for implementing enhanced operational reliability of battery packs in computer systems of one or more disclosed embodiments; of one or more disclosed embodiments. System 200 can be used in conjunction with the computer 101 and cloud environment of the computing environment 100 of FIG. 1 for implementing enhanced operational reliability of battery packs in computer systems of disclosed embodiments. System 200 can select multiple different types of battery cells and identify an optimized arrangement of the selected types of battery cells in a defined order in a battery pack, for example to optimize battery capacity and achieve a longer functional operating period for the battery pack. System 200 can selectively install a porous metal cooling structure on selected battery cells to minimize a temperature gradient in the battery pack.

System 200 includes a Battery Pack Reliability Control 201 to implement enhanced operational reliability of one or more Battery Packs 202, e.g., for supplying battery power to computer systems of disclosed embodiments. In this example, each Battery Pack 202 comprises a plurality of battery cells 203, connected together in a linear battery cell string including multiple types of battery cells. For example, each Battery Pack 202 comprises a linear battery cell string of battery cells 203 from a downstream battery cell B1 203 proximate to a cooling stream entry point to a distal upstream battery cell BN proximate to a cooling stream exit point. A cooling stream for cooling the battery pack 202 moves from the downstream battery cell B1 203 to an upstream battery cell BN, as indicated by an arrow labeled COOLING FLOW. The Battery Packs 202 advantageously can be used with an internal battery feature (IBF) as a local Uninterrupted Power Source (UPS), for example to enhance the robustness of a power design of a mainframe and decrease power line disturbance to mainframe.

System 200 includes a Battery Features Database 204 for storing features and characteristics of each battery cell 203 in the Battery Pack 202 and can store features and characteristics of the Battery Packs 202 of disclosed embodiments. For example, the Battery Features Database 204 can store battery cell selection criteria, such as size, voltage, and battery capacity (types of chemical reaction), and battery cell arrangement options, (e.g., providing locations for battery cells 203 with higher capacity at upstream locations, and lower capacity battery cells at downstream locations in the Battery Packs 202. For example, battery capacities (discharge times) may vary based on ambient temperature in the battery pack 202.

System 200 can access features and characteristics of the Battery Packs 202, such as Inputs 206 comprising, such as T: An array of M different types of battery cells and B: An array of N batteries. System 200 can access Inputs 208, such as X1: graph of temperature versus usable capacity, X2: graph of discharge current versus thermal dissipation, X3: cost of battery (B_cost), X4: other factors affecting battery performance efficiency, X5: temperature gradient versus location in a given battery pack 202 and X6: position of battery in the battery pack. System 200 can access outputs to be optimized such as Outputs 210 Y, such as for each position of battery cells, Battery Bi (i=1 to n), its assignment to one battery type Tj (j=1 to m) of different candidate battery cell types. System 200 can access outputs to be cooled such as Outputs 212 Y2, for each position of battery cell pairs, B_k (k=1, 2; 2, 3; . . . n−1,n), its assignment of a cooling mesh structure to selected battery pairs B_k.

System 200 can include the Battery Configuration Control Component 182 and Battery Type Objective Function Selection Component 184. The Battery Configuration Control Component 182 can control example operations of disclosed methods to implement enhanced operational reliability of battery packs 202. The Battery Type Objective Function Selection Component 184 can receive user input of goals to be optimized, such as to minimize the cost of all cells 203 B1-BN while maximizing battery efficiency, and various other parameters that can influence the efficiency of a battery pack 202.

During discharging, testing results indicate the first battery cell B1 203 has the lowest increasing rate during the discharging process. The remaining battery cells B1-BN 203 have higher and similar increasing rates of the discharging process and can peak at an ambient temperature of about 68° C. For example, in a battery cell string of N (e.g., 23) battery cells, temperature difference for about the first seven battery cells B1-B7 203 may be around 5° C. which is decreasing from upstream to downstream, such as less than 1° C. of the ten cells at downstream. During charging, testing results may indicate that temperatures of all these batteries increase from ambient temperature at 40.5° C. at the beginning of charging process and reach peak temperatures at the end of constant current charging mode at the end of about 1800 seconds. For example, the longest discharging time can occur at ambient temperature of approximately 30° C., which indicates the highest battery capacity under this working condition. Battery capacity decreases when the ambient temperature (ambient T) is higher than 30° C., and the battery capacity decreases more significantly when ambient temperature T is lower, such as close to 0° C. Transient battery temperatures vary along the length of the battery pack 202. The maximum cell surface temperature Ts increases with the increasing of ambient Ts but at a lower increasing rate. In one embodiment, batteries in the battery pack 202 provide equal electric power; however, the battery efficiency increases as the ambient T increases, which contributes to a lower thermal generation rate during the transient discharging process at higher ambient temperature. For example, when a cell surface temperature is in the range of 52-62° C., the battery cell 203 may have the maximum battery discharging time and maximum battery capacity.

System 200 can use the information above to improve the discharge time capacity of the cells B1-BN 203 in the battery pack 202 of disclosed embodiments. For example, system 200 can leverage the temperature gradient along the length of the battery pack 202 to achieve a more uniform discharge profile for the battery pack. Because the surface temperature varies along the length of battery pack, system 200 can assign types of battery cells 203 in the path to maintain surface temperature of all cells to be within an optimal (i.e., selected) range. System 200 can improve discharge capacity of cells 203 by adjusting surface temperature based upon different temperature profiles of different cell types. For example, system 200 can provide various battery arrangements, so that the battery cells 203 can be maintained in the desired temperature range, such as maintaining the battery surface temperature in the range of 52° C.-62° C., to achieve optimized battery capacity. For example, battery pack 202 can be implemented with battery cells 203 having different heat generation values, such as battery cells 203 B1-B15 implemented with a 2.0 W battery cell type, battery cells 203 B6-B19 implemented with a 1.8 W cell type, and battery cells 203 B20-B23 implemented with a 1.5 W cell type. System 200 can use various commercially available types of battery cells 203, each having a same size and voltage and different battery capacity (e.g., types of chemical reaction). System 200 can selectively provide battery cells with higher capacity at the upstream cooling flow locations, and lower capacity battery cells at downstream locations. System 200 can selectively install a heat removal porous metal mesh structure in contact engagement with one or more selected battery cells 203 at selected battery locations in the linear battery cell string of the battery pack to optimize battery cell capacity and maintain a selected temperature range for the selected battery cells.

The Battery Configuration Control Component 182 and Battery Type Objective Function Selection Component 184 for example are used together with the computer 101 and cloud environment of the computing environment 100 of FIG. 1, for example to identify an optimized configuration of the battery packs. System 200 can implement operations of a battery configuration method, to provide enhanced operational reliability of battery packs 202 of disclosed embodiments.

Figure 3:
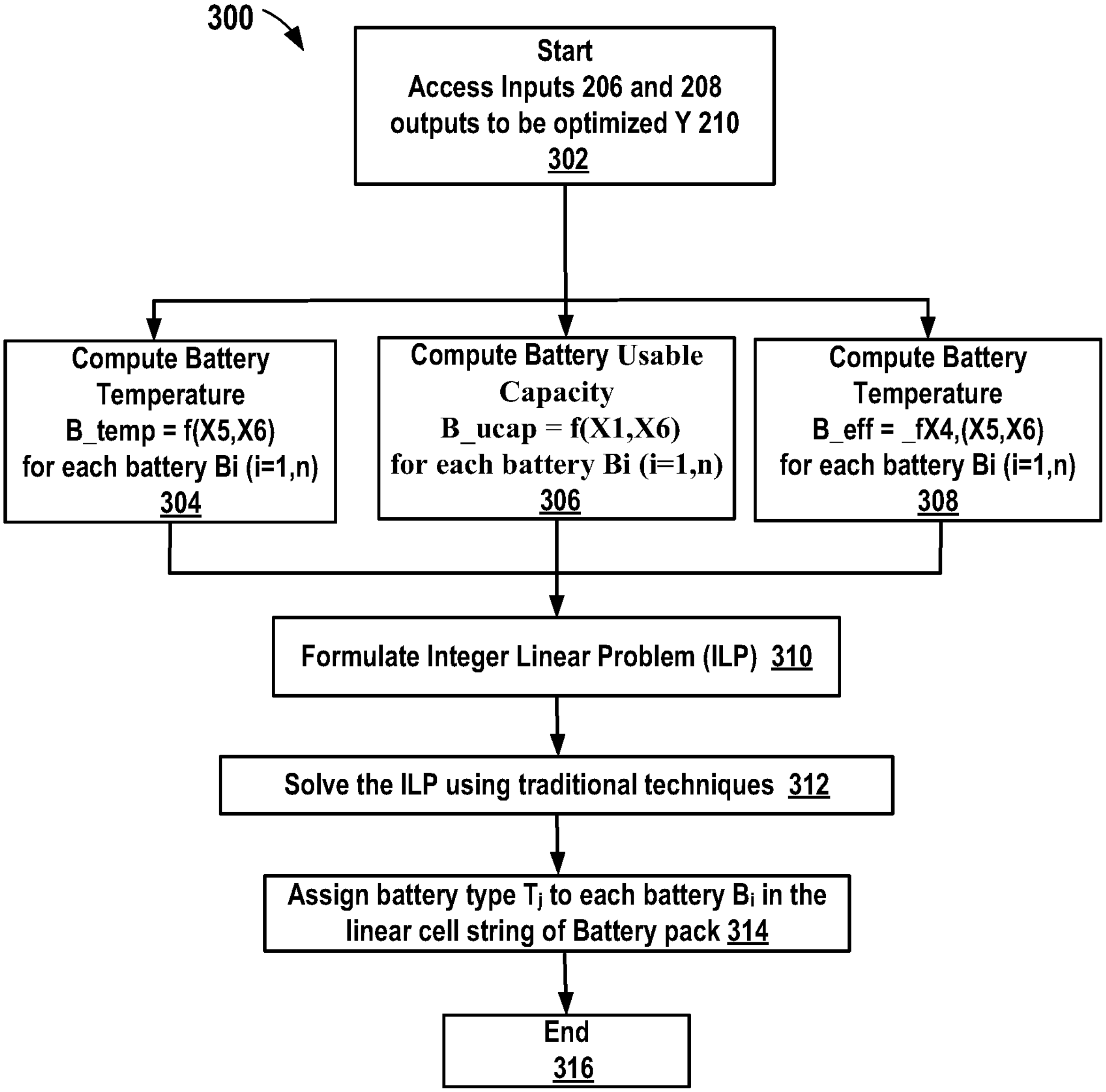
FIG. 3 is a flow chart of example operations of a method for configuring battery packs in computer systems of one or more disclosed embodiments.

FIG. 3 illustrates an example battery configuration method 300 to implement improved performance of battery packs in computer systems of one or more disclosed embodiments. System 200 can implement enhanced battery performance and functional operational period of the battery pack 202 of disclosed embodiments starting at a block 302. At block 302, system 200 accesses Inputs 206 and 208 and identifies outputs to be optimized, such as Outputs 210 Y. At block 304, system 200 computes Battery Temperature using Inputs 208, for example represented by: B_temp=f(X5,X6), for each battery Bi (i=1,n), where X5,X6 respectively represent temperature gradient vs battery cell location in the battery pack 202 and position of the battery cell 203 in the battery pack 202. At block 306, system 200 computes Battery Usable Capacity using Inputs 208, for example represented by: B_ucap=f(X1,X6), for each battery Bi (i=1, n), where X1,X6 respectively represent a graph of temperature vs battery usable capacity and position of the battery cell in the battery pack. At block 308, system 200 computes Battery Efficiency using Inputs 208, for example represented by: B_eff=f(X4,X5,X6), for each battery Bi (i=1,n), where X4 represents other factors affecting battery performance efficiency.

At block 310, system 200 can formulate an Integer Linear Problem (ILP). In Integer linear programming, an objective function and the constraints (other than the integer constraints) are linear. At block 312, system 200 can solve the ILP using traditional techniques, for example to minimize an objective function. At block 312, system 200 can obtain feasible solutions for selection of battery types Tj (j=1 to m) of battery cells 203 for each battery Bi (i=1+n) in the linear string of battery cells 203, to provide enhanced operational reliability of battery packs 202 of disclosed embodiments. At block 314, system 200 assigns battery type Tj to each battery cell Bi 203 in the battery pack 202 and operations end at block 316.

System 200 can implement the integer linear problem formulated at block 310 in FIG. 3 by modeling the ILP as a multi-constrained optimization problem, to optimize the battery configuration for the battery pack 202. An objective function is defined, such as Objective function=optimize function $f(x_1,x_2, \ldots)$ where $x_1,x_2, \ldots$ are parameters that influence the efficiency of a battery pack 202. For instance, $x_1$ could be the cost of a battery cell 203, $x_2$ could be the efficiency loss factor of a battery cell 203 (such as, based on battery surface temperature, which may be dependent on the location of the cell). Various other parameters can be modeled as well. The objective function $f(x_1,x_2, \ldots)$ can be defined, for example to minimize the cost of all cells 203 while maximizing battery efficiency, or battery discharge time, and the like. The battery cells 203 may not have the same discharge profile and the battery discharge time of the battery pack 202 may be limited by the worst performing cell in the battery pack. Battery capacities (discharge times) vary based on ambient temperature and further the battery cell surface temperature may not be uniform along the length of the battery pack. System 200 can implement the ILP formulation at block 310 using user selected objective function parameters including outputs to be optimized. Example ILP formulating and solving operations are illustrated and described with respect to FIG. 4.

Figure 4:
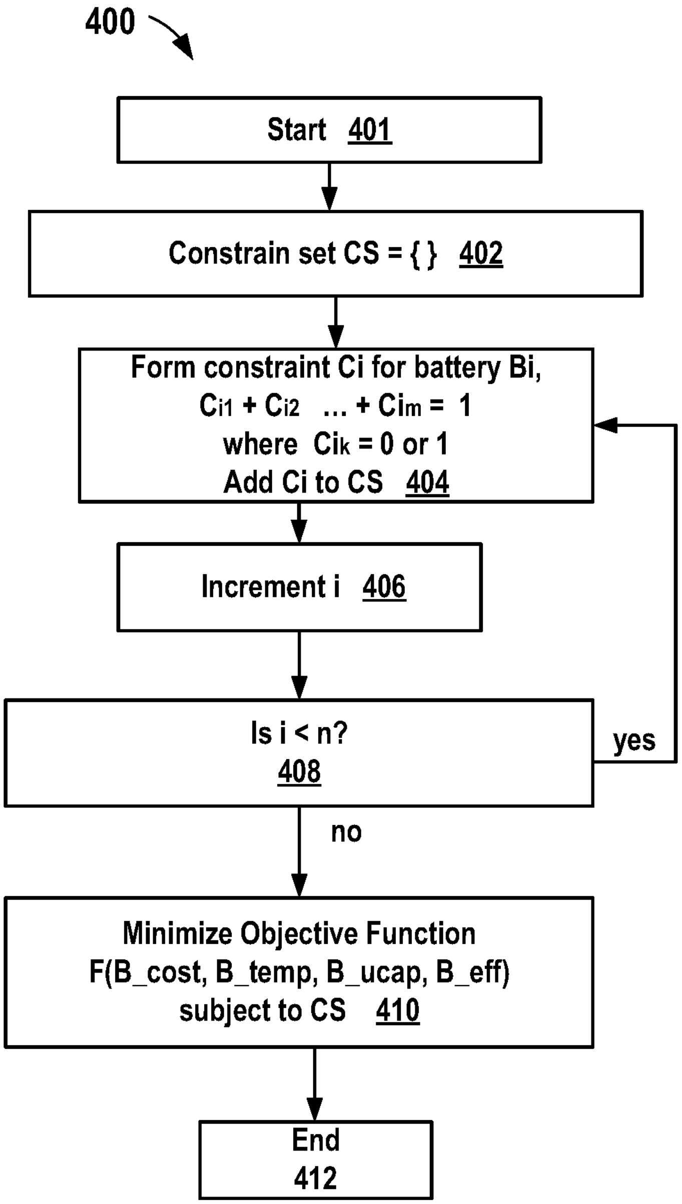
FIG. 4 is a flow chart of an example method to formulate and solve an ILP for configuring battery packs in computer systems of one or more disclosed embodiments.

FIG. 4 illustrates an example multi-constrained optimization method 400 to formulate and solve an ILP for configuring battery packs 202 to implement enhanced operation of the battery packs of one or more disclosed embodiments. Method 400 starts at block 401 as shown. At block 402, a first constrain set CS is defined, for example, Constraint set CS={ }, with i=1. At block 404, a constraint Ci is formed for each battery or battery cell Bi, with Ci1+Ci2 . . . +Cim+1, where Cik=0 or 1, and the Constraint Ci is added to the constrain set CS. At block 406, i is incremented and forming a next constrain Ci is continued at block 404 until i is not less than n, as identified at block 408, where n represents the number Bi of battery cells 203. At block 410, the Objective function is minimized subject to the constraint set CS. As shown, the example Objective function=f(B_Cost, B_temp, B_ucap, B_eff) where B_Cost is the cost of battery cell Bi, and the parameters B_temp, B_ucap, and B_eff represent the respective battery parameters calculated at blocks 304, 306, and 308 in FIG. 3. For example, system 200 minimizes the Objective function to optimize battery capacity and extend a functional period of the battery pack. At block 410, the minimized Objective function enables system 200 to assign battery type $T_j$ to each battery $B_i$ in the battery pack 202. Operations end at block 412.

Figure 5:
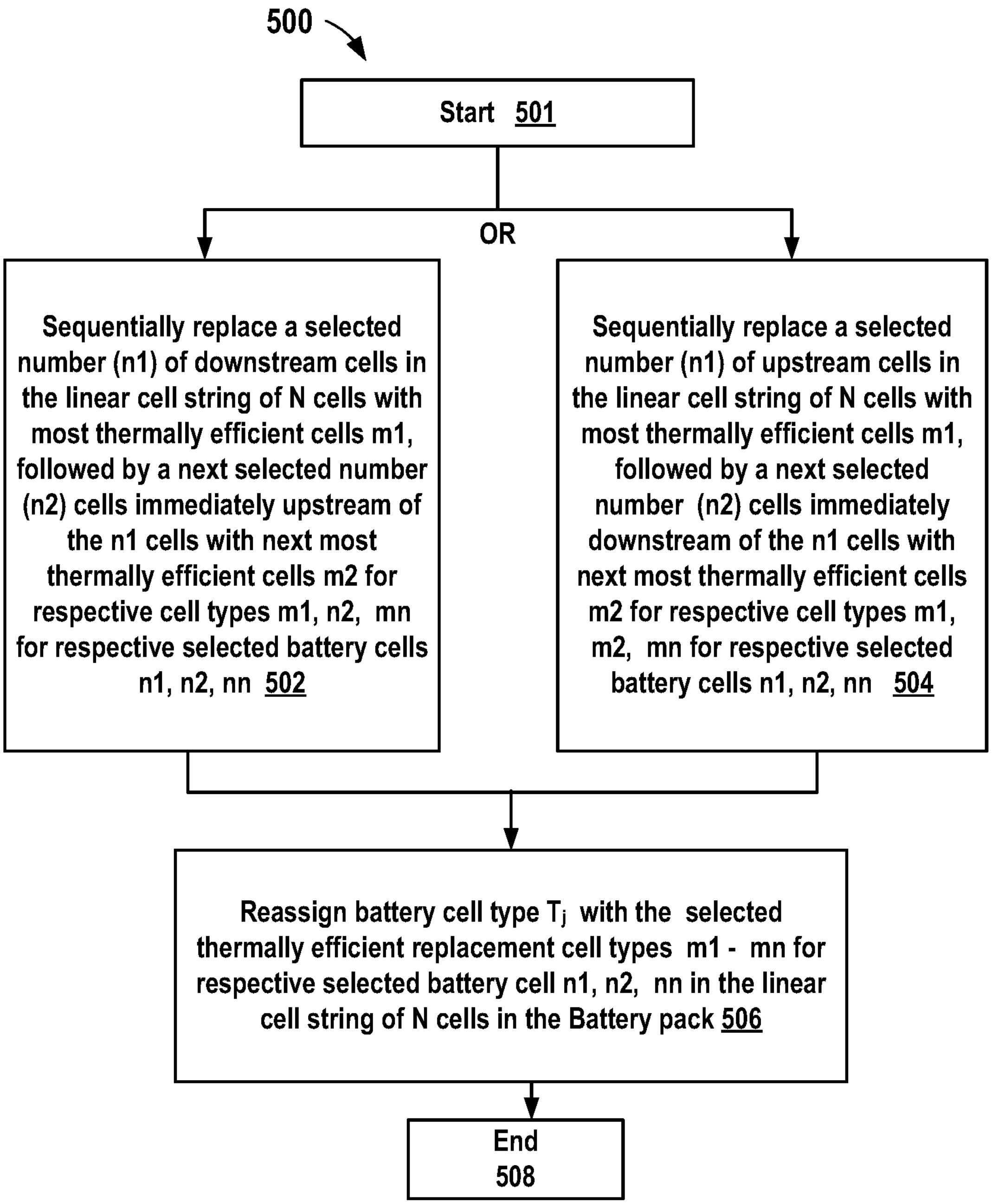
FIG. 5 is a flow chart of further example operations for configuring battery packs in computer systems of one or more disclosed embodiments.

FIG. 5 illustrates further example operations 500 for configuring battery packs to implement enhanced operations of battery packs for use in computer systems of one or more disclosed embodiments starting at block 501. At block 502, system 200 sequentially replaces a selected number (n1) of downstream cells in the battery pack linear battery cell string of N cells with most thermally efficient cells m1, followed by a next selected number (n2) cells immediately upstream of the n1 cells with next most thermally efficient cells m2, (e.g., for each respective next cell types m1, m2, mn for respective selected battery cells n1, n2, nn). The first n1 downstream cells (e.g., 203 B1, B2, B3, B4) in the battery pack linear cell string, can be replaced with the most thermally efficient cells m1. In one embodiment, the battery pack linear battery cell string includes a total N battery cells (e.g., 203 B1 to 203 BN, where N=23, (e.g., battery cells 203 #1-#23). System 200 can selectively replace respective selected numbers of cells (n1, n2, nn) for each of the respective different types (m1, m2, mn) of battery cells starting from downstream cells in the battery pack linear cell string. For example at block 502, by selectively replacing selected battery cells (respective downstream cells (n1, n2, nn) with respective different cell types (m1, m2, mn), peak battery cell temperatures can be reduced, to minimize worst case battery pack operation.

Alternatively system 200 performs operations at block 504 instead of the above described operation of block 502. At block 504, system 200 sequentially replaces respective selected numbers of cells (n1, n2, nn) for each of the respective different types (m1, m2, mn) of battery cells starting from upstream battery cells (e.g., battery cells 203 BN-3, BN-2, BN-1, and BN) in the battery pack linear cell string. For example at block 504, by selectively replacing selected battery cells (respective upstream cells (n1, n2, nn) with respective different cell types (m1, m2, mn), average battery cell temperatures can be reduced, to improve average operation for battery pack 202. At block 506, system 200, the battery cell type Tj, such as assigned at block 314 in FIG. 3, can be reassigned corresponding from operations performed at block 502 or alternatively operations performed at block 504. At block 506, system 200 can assign the respective thermally efficient replacement cell types m1-mn for respective selected battery cell n1, n2, nn in the linear battery cell string of N cells in the battery pack 202, starting from upstream battery cells for the operations performed at block 502 or alternatively starting from downstream battery cells for the operations performed at block 504, to improve selected operations of battery pack 202. Operations end as indicated at block 508.

Figure 6:
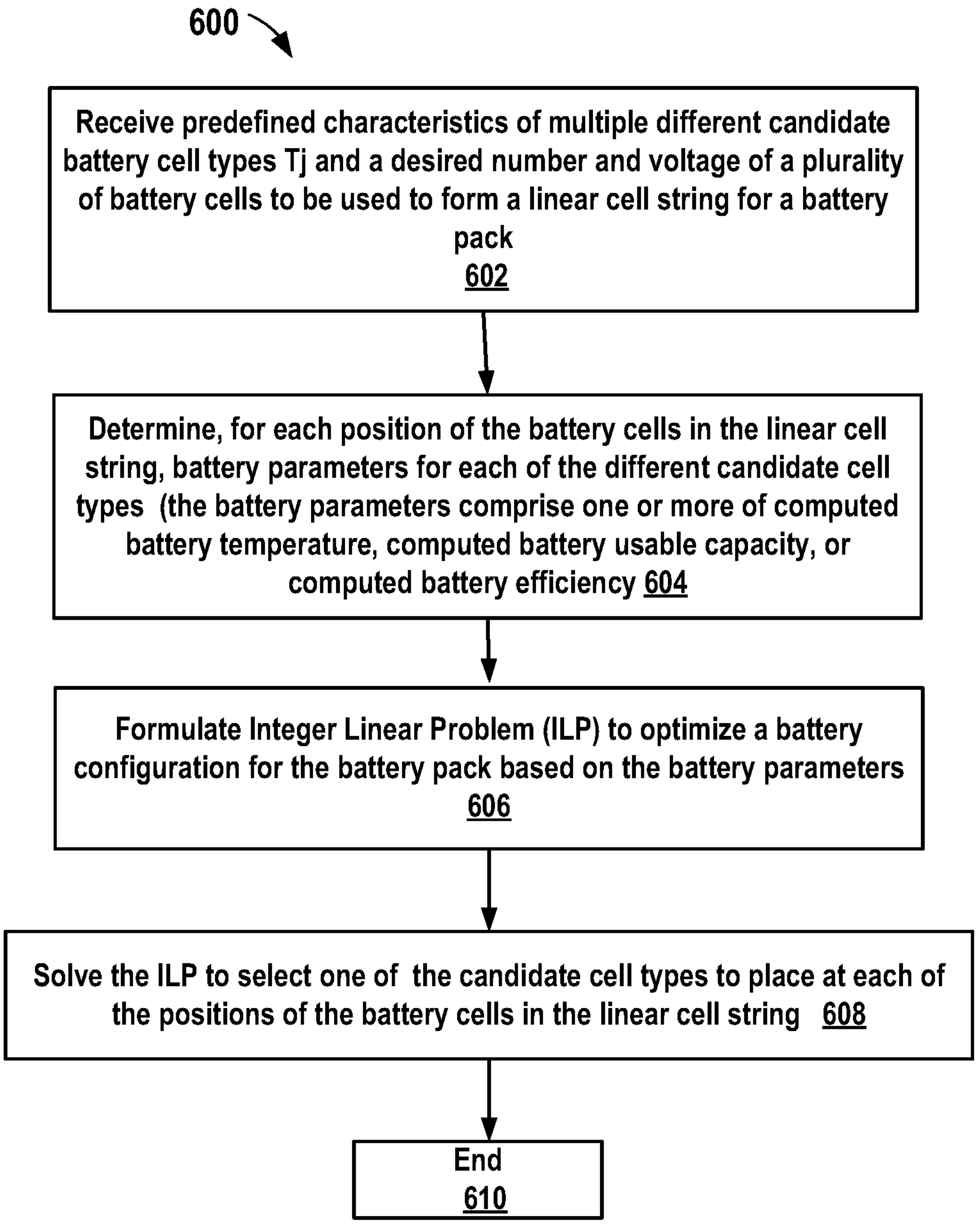
FIG. 6 is a flow chart of a method for configuring battery packs in computer systems of one or more disclosed embodiments.

FIG. 6 illustrates an example method 600 for configuring battery packs of one or more disclosed embodiments. At block 602, system 200 receives predefined characteristics of multiple different candidate battery cell types and a desired number, size and voltage of a plurality of battery cells to be used to form a linear battery cell string for a battery pack. For example, the predefined characteristics of each of the multiple different candidate battery cell types include battery Capacity in milli-Ampere hour (mAh), battery Heat generation in watts (W), battery Thermal conductivity in watts per milli-kelvin (W/mK), and battery specific heat in Jules per specific heat kelvin (J/kgK). In one disclosed embodiment, the desired number of battery cells N is 23 battery cells, each having, e.g., the same size (e.g., height, diameter or width, and length), and the same voltage (e.g., 3.6 volts), in a linear battery cell string to form the battery, pack 202.

At block 604, system 200 determines, for each position of the battery cells in the linear cell string, battery parameters for each of the different candidate cell types. For example, system 200 can determine the battery parameters, for each battery position and each battery type, comprising one or more of computed battery temperature, computed battery usable capacity, computed battery efficiency and other selected battery parameters. As discussed above, the battery parameters for the different candidate cell types can vary depending on the position that the battery cell is located in the linear cell string. For example, the battery temperature for a cell type can vary depending on whether it is at the front of the string (where cooling is greater) or at the end of the string.

At block 606, system 200 formulates an integer linear problem to optimize a battery configuration for the battery pack based on the calculated battery parameters for each position of the plurality of battery cells. For example, system 200 models the integer linear problem as a multi-constrained optimization problem, defining an objective function based on selected battery parameters for each battery cell. At block 608, system 200 solves the integer linear problem to select, one of the different candidate battery types to place at each of the positions of the battery cells in the linear cell string. Operations end as indicated at block 610.

In disclosed embodiments, a metal structure having high thermal conductivity, such as a metal mesh structure is selectively provided to be positioned in contact engagement with selected battery cells. One or more metal mesh structures are selectively provided to compensate for a difference in surface temperature of battery cells at identified position in the linear battery cell string of the battery pack, to provide optimal battery cell capacity with a more uniform surface temperature of all the battery cells. The surface temperature of battery cells can vary by position of battery cells, with some battery cells at some positions having a lower surface temperature than other battery cells. For example, the metal mesh structure can be positioned with selected pairs of battery cells to maintain in a desired surface temperature range for the selected battery cells, to achieve optimal battery capacity. In disclosed embodiments, the cooling metal mesh structure is configured to minimize flow impedance to a cooling flow path of the battery pack, while minimizing a battery cell surface temperature gradients of the linear battery cell string of the battery pack. In one embodiment, the cooling porous metal mesh structure is formed of an Aluminum or Copper cylindrical mesh structure. The cylindrical metal mesh structure is readily deformable, enabling battery pack installation and removal for example for battery cell servicing.

Figure 7:
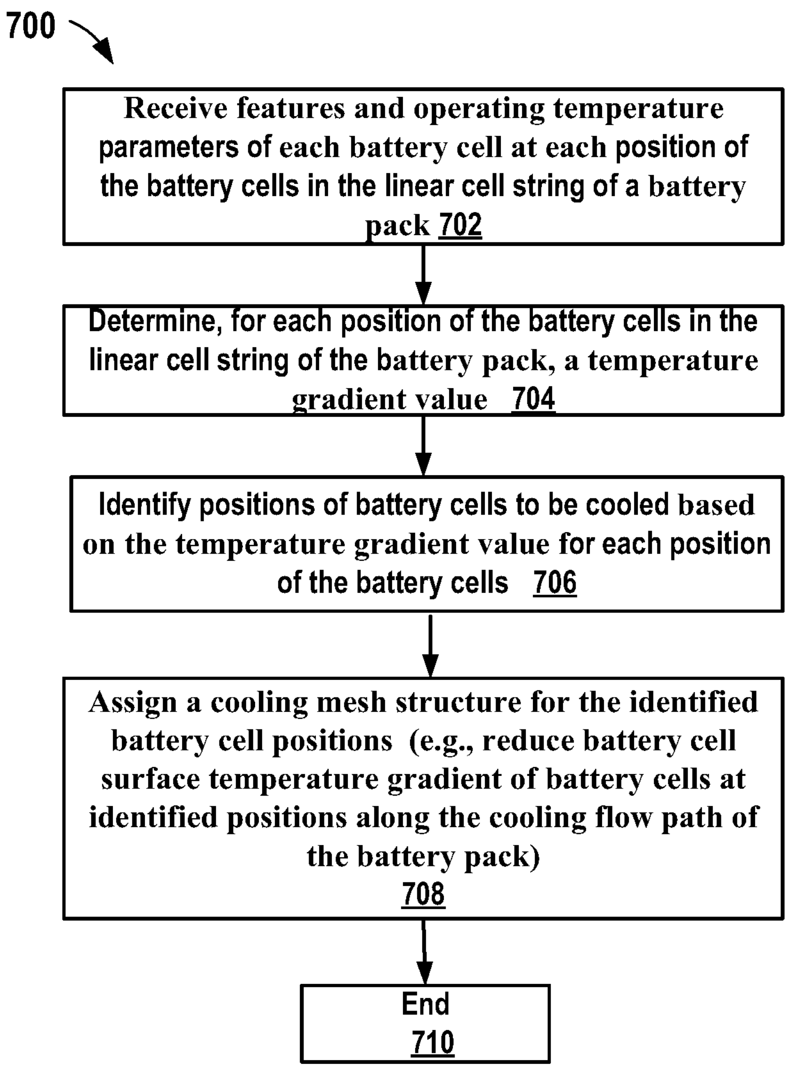
FIG. 7 is a flow chart of example operations for implementing selective battery cooling of battery cells at identified positions of in a linear battery cell string of a battery pack of one or more disclosed embodiments.

FIG. 7 illustrates operations of an example method 700 for implementing selective battery cooling of battery packs 202 of one or more disclosed embodiments. At block 702, system 200 receives features and operation temperature parameters of each battery cell at each assigned position of the battery cells in the linear string of a battery pack 202. At block 704, system 200 determines, for each position of battery cells in the linear battery cell string of the battery back 202, a temperature gradient. At block 706, system 200 identifies positions of battery cells to be cooled based on the temperature gradient value for each position of the battery cells to optimize a battery capacity for the battery pack 202.

At block 706, system 200 assigns a cooling mesh structure for the selected battery cell positions, for example to reduce the battery cell surface temperature gradient of the battery cells. At block 708, system 200 can provides the battery pack 202 with example cooling metal mesh structures to be selectively installed in contact engagement with selected battery cells at the selected battery cell positions. The installed cooling metal mesh structure can provide enhanced discharge capacity of the battery cells by adjusting the surface temperature of the selected battery cells at selected positions. The installed cooling metal mesh structure can effectively minimize temperature gradients for the battery cells at the identified positions in the battery pack 202. Operations end at block 710.

In disclosed embodiments, the cooling mesh structure has a selected configuration to provide effective cooling performance and minimize flow impedance to the cooling flow path of the battery pack 202. For example, the assigned cooling mesh structures can minimize a battery cell surface temperature gradient of associated battery cells, and fit into an existing design structure for the battery pack, without requiring modification or addition of extra structure. Each cooling mesh structure provides additional surface area of cooling for the battery pack 202 and improve overall discharge capacity of battery pack.

Figure 8A:
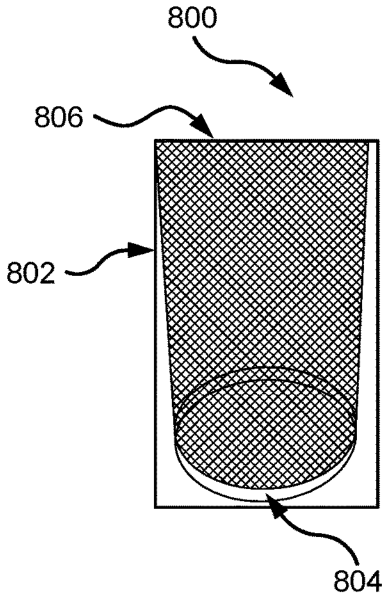
FIGS. 8A and 8B illustrate example battery cooling metal mesh structures for battery cooling of battery packs of one or more disclosed embodiments.

FIG. 8A illustrate an example battery cooling metal mesh structure 800 for battery cooling of battery packs of one or more disclosed embodiments. The cooling metal mesh structure 800 has a selected shape 802, such as the illustrated generally cylindrical shape from a bottom surface 804 to an upper surface 806.

Figure 8B:
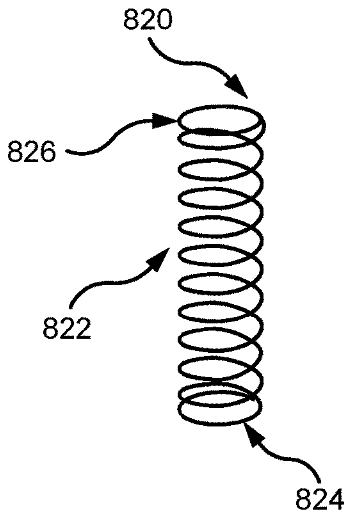

FIG. 8B illustrate another example battery cooling metal mesh structure 820 for battery cooling of battery packs of one or more disclosed embodiments. The cooling metal mesh structure 820 has a selected shape 822, such as the illustrated generally cylindrical, spiral shape 822 extending from a bottom surface 824 to an upper surface 826.

In disclosed embodiments, both cooling mesh structures 800 and 820 can provide additional cooling for battery packs 202 to minimize battery cell surface temperature gradients of associated battery cells 203 at identified positions to improve overall discharge capacity of battery pack. The cooling mesh structures 800 and 820 are deformable structures, (e.g., compressible structures), formed of a selected flexible metal mesh material. The cooling mesh structures 800 and 820 are formed of a selected flexible metal mesh material having high thermal conductivity, such as Aluminum (Al)), Copper (Cu), and the like. The cooling mesh structures 800 and 820 are deformable, providing flexibility to enable installation and removal of battery packs 202, such as for battery servicing. A height of the metal mesh members can be about the same height as the associated battery cells 203. A diameter of the metal mesh forming the cooling mesh structures 800 and 820 is selectively provided based on an available empty space to receive the cooling mesh structures, between a PCB and at selected positions of the battery cells 203 of the battery pack 202. For example, the metal mesh diameter can be in a range between 5 mm and 50 mm and a selected metal mesh thickness can be in a range between 1 mm and 8 mm.

Figure 9A:
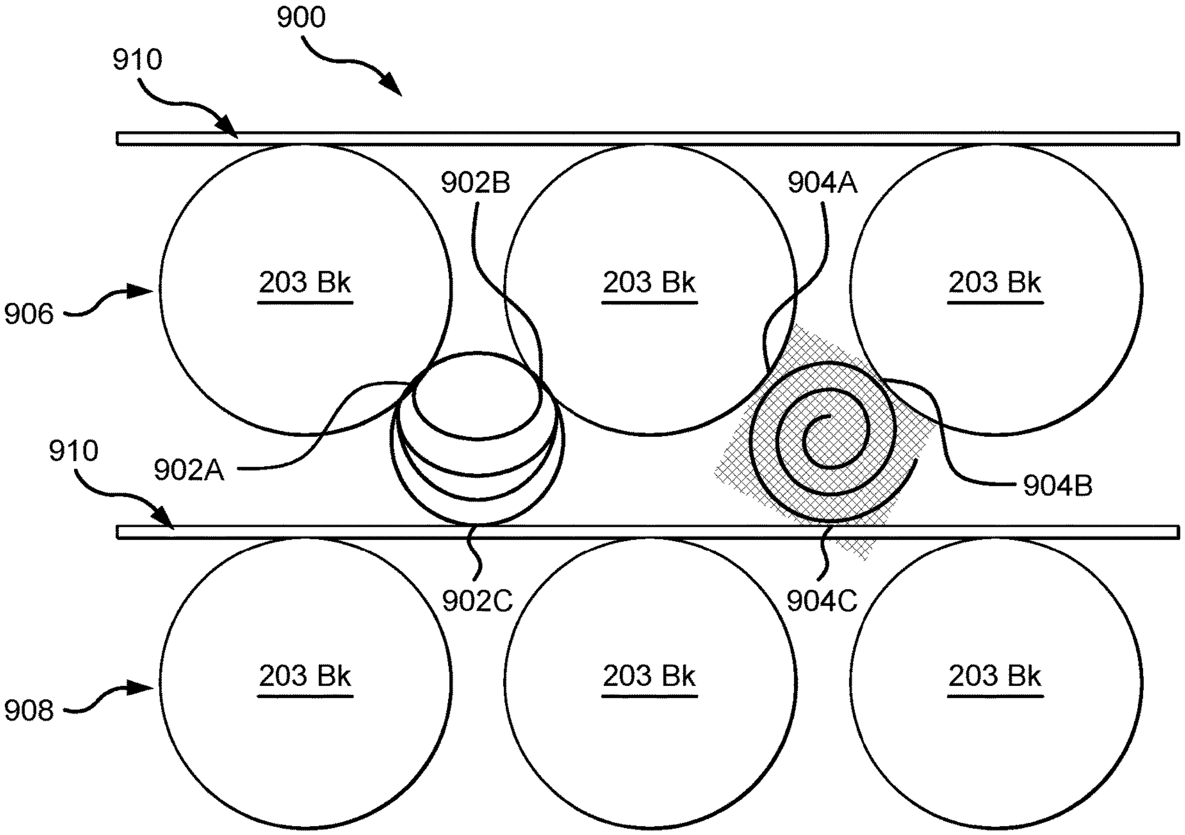
FIG. 9A schematically illustrates an example battery cooling configuration with an example pair of battery cooling metal mesh structures of one or more disclosed embodiments.

FIG. 9A schematically illustrates an example battery cooling configuration 900 with a first example cooling metal mesh structure 902 and a second example cooling metal mesh structure 904 of one or more disclosed embodiments. FIG. 9A provides a top plan view of the battery cooling configuration 900, illustrating a portion a given battery pack 202. As shown, the battery-cooling configuration 900 includes three battery cells 203 Bk with the example cooling metal mesh structures 902 and 904 located between respective battery pairs. Both of the example cooling metal mesh structures 902 and 904 have an overall cylindrical shape, such as the illustrated cooling mesh structures 800 and 820 in the respective FIGS. 8A and 8B.

Figure 9B:
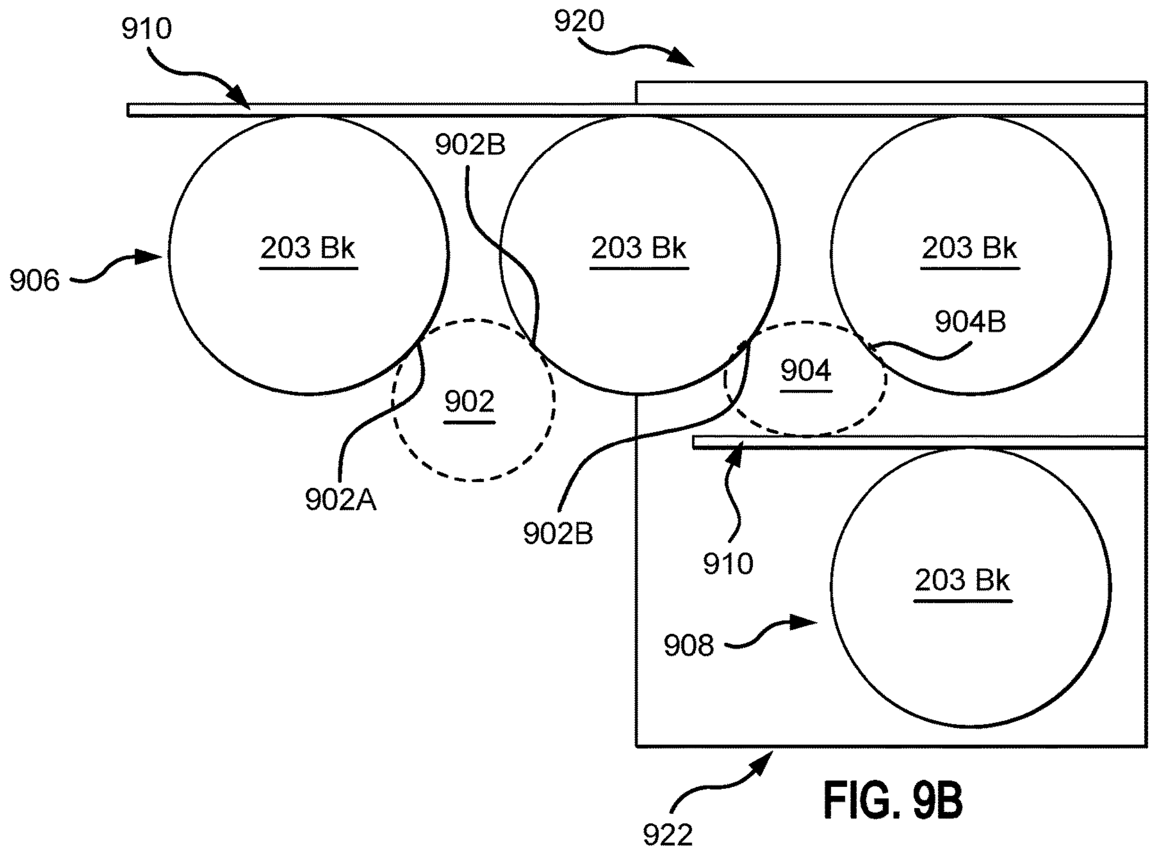
FIGS. 9B and 9C schematically illustrate details of a partial insertion position and an operational position of an example battery cooling configuration of one or more disclosed embodiments.

In a disclosed embodiment, the cylindrical cooling mesh structure 902 includes multiple mesh layers, as shown in the top plan view of FIG. 9A. In this example, the structure 902 includes multiple concentric circles or ovals. As shown in FIG. 9B, the cylindrical cooling mesh structure 904 can include a coil or spiral shaped cylindrical member, such as shown in cylindrical cooling mesh structure 820 in FIG. 8B.

Either of the cooling metal mesh structures 902 and 904 can be selectively used at assigned battery cell positions in the linear battery cell string of battery packs 202 to provide additional cooling for battery packs, for example based on cooling requirements of battery cell pair 203 Bk at the identified battery positions in the battery packs 202. For example, one of the cooling metal mesh structures 902 or 904 can be selected for use at identified battery pair positions based on available space with a given battery pack 202.

For example, the cooling mesh structures 902 and 904 can be installed to fit into an available empty space or gap in the existing battery rack chassis (not shown in FIG. 9A) without requiring any additional area and with no requirement for extra support structure in the battery chassis for the cylindrical metal mesh structures. Each of the installed cooling metal mesh structures 902 and 904 is provided in cooling engagement with associated battery cells 203 at identified battery cell positions in the linear battery cell string of battery pack 202.

For example, the cooling mesh structures 902 and 904 can be fixedly mounted to selected battery cells 203 as respectively indicated at 902A, 902B, and 904A, 904B. A selected glue or adhesive Thermal Interface Material (TIM) can be used fixedly attach or secure the cooling mesh structures 902 and 904 to the battery cells 203.

Alternatively, the cooling mesh structures 902 and 904 can be mounted to an available supporting printed circuit board (PCB) 910, as respectively indicated at 902C and 904C. The PCB 910 is spaced apart from the battery cells 203 Bk in an enclosure or chassis, for example containing multiple parallel battery packs 202. The cooling mesh structures 902 and 904 can be fixedly secured to the PCB 910, such as by soldering or using selected glue.

Figure 9C:
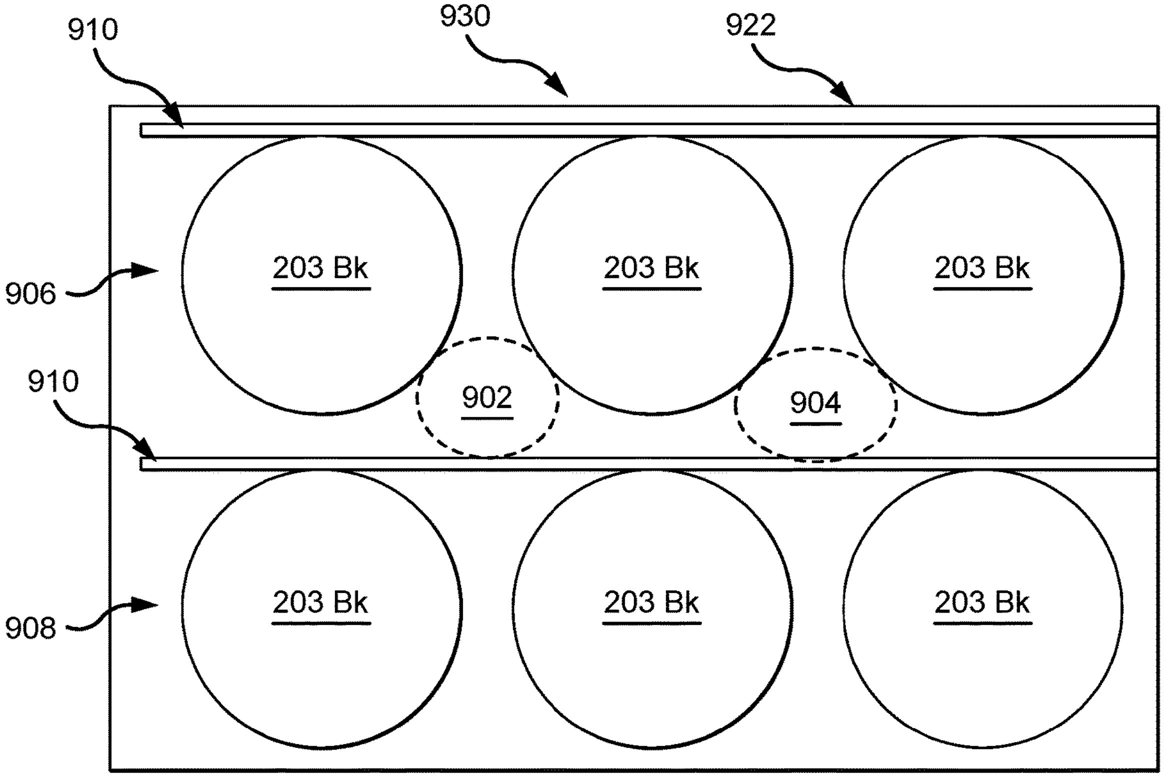

FIGS. 9B and 9C schematically illustrate details of a partial insertion position 920 and an operational position 920 of the example battery cooling configuration 900 of one or more disclosed embodiments. As shown in FIGS. 9B and 9C, the cooling mesh structures 902 and 904 are mounted to respective battery cells 203 Bk, and are not mounted to the PCB 910. The cooling mesh structures 902 and 904 are deformable structures and have sufficient flexibility to move with the associated battery rack during installation and removal of battery packs 202 from an enclosure or battery chassis 922, such as for battery servicing.

In the partial insertion position 920 of FIG. 9B, the cooling mesh structure 902 is located outside the battery chassis 922 and is in its uncompressed state as shown. The cooling mesh structure 904 is located inside the battery chassis and is compressed in press-fit engagement with associated battery cells 203 Bk.

In the operational insertion position 930 of FIG. 9C, both cooling mesh structures 902 and 904 are located inside the battery chassis 922 and are compressed in press-fit engagement with associated battery cells 203 Bk. The cooling mesh structures 902 and 904 are deformable, providing effective thermal engagement with associated battery cells 203 Bk in the operational position 920.

Figure 10A:
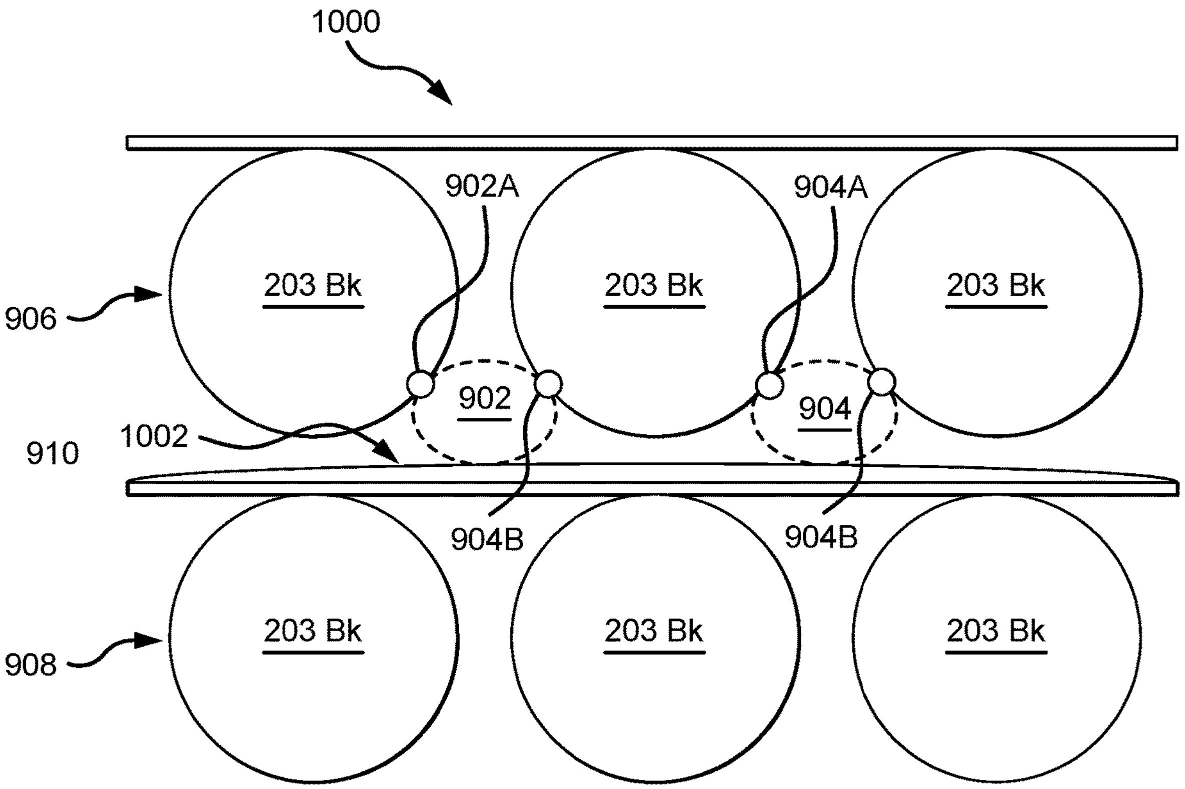
FIGS. 10A and 10B schematically illustrate an example battery cooling configuration with an example pair of battery cooling metal mesh structures and a slider structure of one or more disclosed embodiments.
Figure 10B:
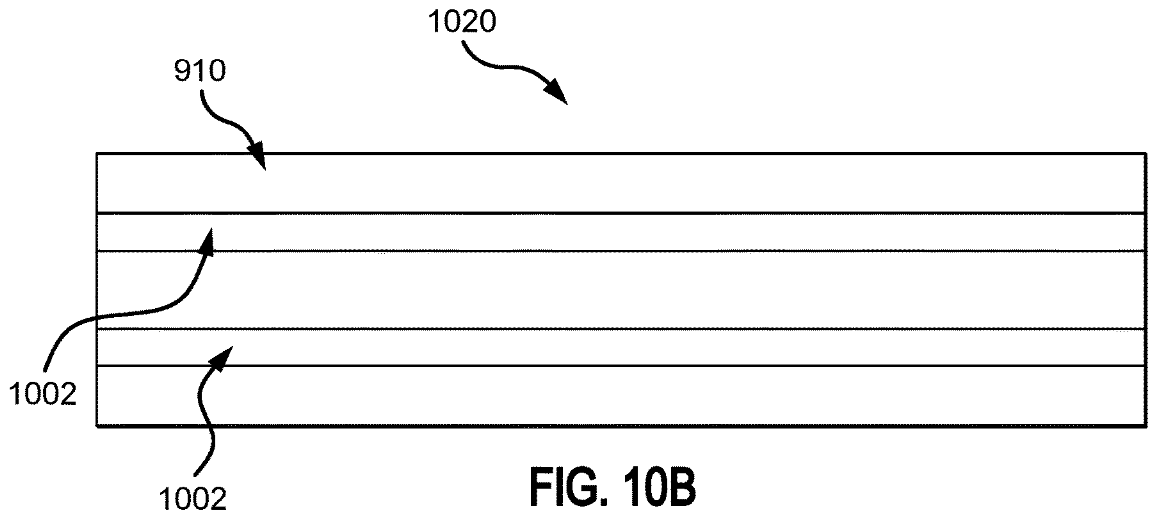

FIGS. 10A and 10B schematically illustrate an example battery cooling configuration 1000 with the example pair of battery cooling metal mesh structures 902 and 904 of one or more disclosed embodiments. The same reference numbers are used as used in FIGS. 9A, 9B and 9C for similar or identical components. The battery cooling configuration 1000 includes an additional slider 1002 provided with one PCB 910 to allow battery packs 202 with attached cooling structures 902 and 904 to be easily moved (inserted or removed from the battery chassis 922) without interfering with other on backside components or features. The slider 1102 can be formed of a selected metal or plastic material. The slider 1002 can be arranged a pair of slider rails (as illustrated in FIG. 10B). The slider rails 1102 can be attached to or formed on a backside of one PCB 910 that supports battery cells 203 Bk as illustrated in FIGS. 10A and 10B.

FIG. 10B illustrates an example arrangement 1020 of the PCB 910 and slider rails 1002 shown without the battery cells and cooling metal mesh structures 902 and 904. The slider rails or plate 1002 can be attached to the PCB 910, (e.g., screwed, soldered or adhesively attached to of the PCB). The slider rails 1002 can be fabricated directly onto of PCB 910, for example using metal plating manufacturing methods commonly used in PCB industry.

Figure 11A:
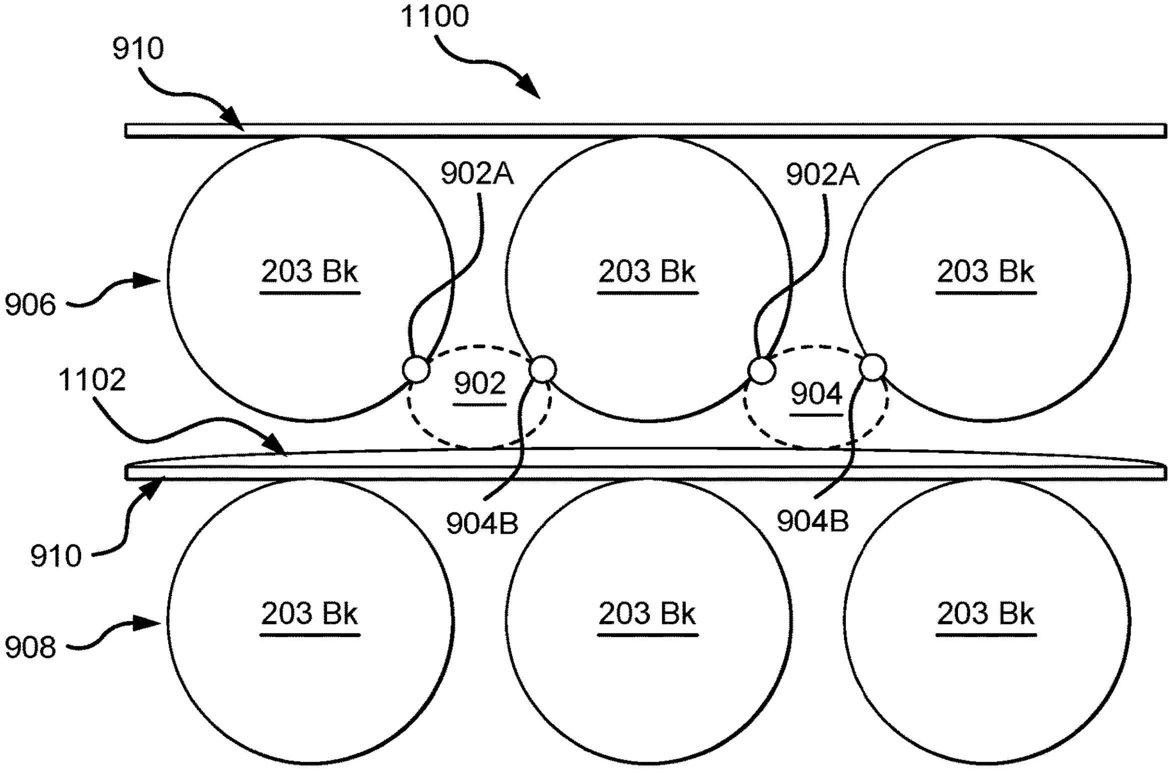
FIGS. 11A and 11B schematically illustrate another example battery cooling configuration with an example pair of battery cooling metal mesh structures and another slider structure of one or more disclosed embodiments.
Figure 11B:
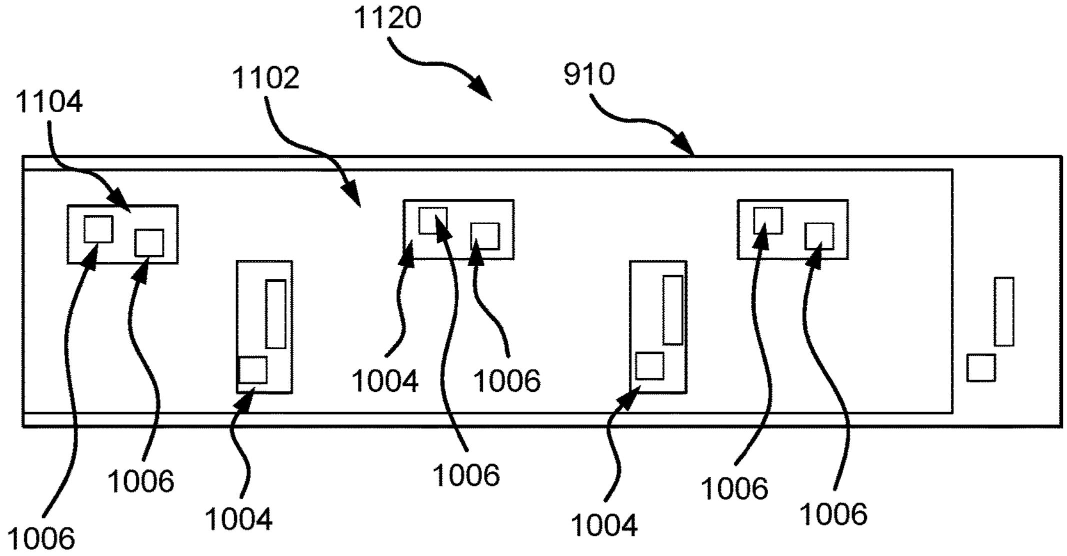

FIGS. 11A and 11B schematically illustrate another example battery cooling configuration 1100 with the example pair of battery cooling metal mesh structures 902 and 904 of one or more disclosed embodiments. The same reference numbers are used as used in FIGS. 9A, 9B. 9C. 10A and 10B for similar or identical components. The battery cooling configuration 1100 includes another configuration of an example slider 1102, provided with the PCB 910 to allow battery packs 202 with battery cells 203 Bk and attached cooling structures 902 and 904 to easily inserted or removed from battery chassis. The slider 1102 can be a plate member attached to a backside of one PCB 910 that supports battery cells 203 Bk. The slider plate 1102 can be formed of a selected metal or plastic material.

FIG. 11B illustrates an example arrangement 1120 of the PCB 910 and slider 1002 shown without the battery cells and cooling metal mesh structures 902 and 904. In a disclosed embodiment, the slider 1102 includes a plurality of cutouts or opening 1104 to accommodate various components 1106 located on the PCB 910. The slider 1102 can be attached to the PCB 910, (e.g., screwed, soldered or adhesively attached to of the PCB) as shown in FIGS. 11A and 11B.

While the foregoing is directed to embodiments of the present invention, other and further embodiments of the invention may be devised without departing from the basic scope thereof, and the scope thereof is determined by the claims that follow.

What is claimed is:

1. A method comprising:

receiving predefined characteristics of different candidate battery cell types and a predefined number and voltage of a plurality of battery cells to be used to form a linear battery cell string for a battery pack;

determining, for each position of the battery cells in the linear cell string, battery parameters for each of the different candidate battery cell types, wherein the battery parameters comprise at least one of computed battery temperature, computed battery usable capacity, and computed battery efficiency;

formulating an integer linear problem to optimize a battery configuration for the battery pack based on the battery parameters; and solving the integer linear problem to select, one of the different candidate battery cell types to place at each of the positions of the battery cells in the linear cell string.

2. The method of claim 1, wherein formulating the integer linear problem comprises modeling the integer linear problem as a multi-constrained optimization problem, defining an objective function based on the selected parameters for each of the different candidate cell types.

3. The method of claim 1, wherein formulating the integer linear problem comprises defining an objective function based on the battery parameters for each of the different candidate battery cell types, and minimizing the objective function to optimize battery capacity and extend a functional operating period of the battery pack.

4. The method of claim 1, wherein the linear battery cell string comprises N battery cells including first upstream battery cells through ending downstream battery cells, and further comprises selectively replacing a number (n1) of downstream battery cells in the linear battery cell string with most thermally efficient cells of the different candidate battery cell types, to reduce peak battery cell temperatures.

5. The method of claim 1, wherein the linear battery cell string comprises N battery cells including first upstream battery cells through ending downstream battery cells, and further comprises selectively replacing a number (n1) of upstream battery cells in the linear battery cell string with most thermally efficient cells of the different candidate battery cell types, to reduce average battery cell temperatures.

6. The method of claim 1, further comprises assigning battery cells with higher capacity of the different candidate battery cell types at upstream locations and assigning battery cells with lower capacity of the different candidate battery cell types at downstream locations in the linear battery cell string of the battery pack.

7. The method of claim 1, wherein solving the integer linear problem further comprises minimizing an objective function to optimize selected battery parameters to obtain optimal battery performance of the battery pack.

8. The method of claim 1, wherein predefined characteristics of different candidate battery cell types comprise at least one of battery cost, battery capacity, battery thermal conductivity, or battery heat generation.

9. The method of claim 8, wherein formulating the integer linear problem comprises defining an objective function to minimize one or more of the battery functions.

10. The method of claim 8, wherein formulating the integer linear problem comprises receiving a user input to select one or more of the battery functions to be optimized, and defining an objective function to optimize the selected battery functions.

11. A system, comprising:
- a processor; and
- a memory, wherein the memory includes a computer program product configured to perform operations for configuring a battery pack in computer systems, the operations comprising:
- receiving predefined characteristics of different candidate battery cell types and a predefined number and voltage of a plurality of battery cells to be used to form a linear battery cell string for a battery pack;
- determining, for each position of the battery cells in the linear cell string, battery parameters for each of the different candidate battery cell types, wherein the battery parameters comprise at least one of computed battery temperature, computed battery usable capacity, and computed battery efficiency;
- formulating an integer linear problem to optimize a battery configuration for the battery pack based on the battery parameters; and
- solving the integer linear problem to select, one of the different candidate battery cell types to place at each of the positions of the battery cells in the linear cell string.

12. The system of claim 11, wherein formulating the integer linear problem comprises modeling the integer linear problem as a multi-constrained optimization problem, defining an objective function based on selected battery parameters for each battery cell.

13. The system of claim 11, wherein formulating the integer linear problem comprises defining an objective function based on selected battery parameters for each of the different candidate battery cell types, and minimizing the object function to optimize battery capacity and extend a functional operating period of the battery pack.

14. The system of claim 11, wherein solving the integer linear problem further comprises minimizing an objective function to optimize selected battery parameters to obtain optimal battery performance of the battery pack.

15. The system of claim 11, further comprises selectively installing a heat removal porous metal mesh structure in contact engagement with one or more selected battery cells at selected battery locations in the linear battery cell string of the battery pack to maintain a selected temperature range and optimal battery cell capacity for the selected battery cells.

16. A computer program product for configuring a battery pack in computer systems, the computer program product comprising:
- a computer-readable storage medium having computer-readable program code embodied therewith, the computer-readable program code executable by one or more computer processors to perform an operation comprising:
- receiving predefined characteristics of different candidate battery cell types and a predefined number and voltage of a plurality of battery cells to be used to form a linear battery cell string for a battery pack;
- determining, for each position of the battery cells in the linear cell string, battery parameters for each of the different candidate battery cell types, wherein the battery parameters comprise at least one of computed battery temperature, computed battery usable capacity, and computed battery efficiency;
- formulating an integer linear problem to optimize a battery configuration for the battery pack based on the battery parameters; and
- solving the integer linear problem to select, one of the different candidate battery cell types to place at each of the positions of the battery cells in the linear cell string.

17. The computer program product of claim 16, wherein formulating the integer linear problem comprises modeling the integer linear problem as a multi-constrained optimization problem, defining an objective function based on the battery parameters for each of the different candidate battery cell types.

18. The computer program product of claim 16, wherein formulating the integer linear problem comprises defining an objective function based on the battery parameters for each of the different candidate battery cell types, and minimizing the object function to optimize battery capacity and extend a functional operating period of the battery pack.

19. The computer program product of claim 16, wherein solving the integer linear problem further comprises minimizing an objective function to optimize selected battery parameters to obtain optimal battery performance of the battery pack.

20. The computer program product of claim 16, further comprises selectively installing a heat removal porous metal mesh structure in contact engagement with one or more selected battery cells at selected battery locations in the linear battery cell string of the battery pack to maintain a selected temperature range and optimize battery cell capacity for the selected battery cells.

* * * * *